US010211673B2

(12) United States Patent
Terricciano et al.

(10) Patent No.: US 10,211,673 B2
(45) Date of Patent: Feb. 19, 2019

(54) APPARATUS AND METHODS FOR TIMESTAMPING ELECTRICAL DATA IN A PANEL METER

(71) Applicant: Siemens Industry, Inc., Alpharetta, GA (US)

(72) Inventors: Paul Terricciano, Roswell, GA (US); Matthew Leidy, Norcross, GA (US)

(73) Assignee: Siemens Industry, Inc., Alpharetta, GA (US)

( * ) Notice: Subject to any disclaimer, the term of this patent is extended or adjusted under 35 U.S.C. 154(b) by 454 days.

(21) Appl. No.: 14/829,758

(22) Filed: Aug. 19, 2015

(65) Prior Publication Data

US 2016/0258986 A1 Sep. 8, 2016

Related U.S. Application Data

(60) Provisional application No. 62/127,915, filed on Mar. 4, 2015.

(51) Int. Cl.
*H02J 13/00* (2006.01)
*G01R 19/25* (2006.01)
*G01R 13/30* (2006.01)

(52) U.S. Cl.
CPC ...... *H02J 13/0062* (2013.01); *G01R 19/2513* (2013.01); *G01R 13/305* (2013.01); *Y02E 60/7838* (2013.01); *Y04S 40/124* (2013.01)

(58) Field of Classification Search
CPC . H02J 13/0062; G01R 19/2513; G01R 19/25; G01R 13/305; G01D 4/002; G01D 4/004; G01D 4/006; G01D 4/008
See application file for complete search history.

(56) References Cited

U.S. PATENT DOCUMENTS 8,350,417 B1 1/2013 Dooley
2004/0203620 A1 10/2004 Janakiraman
(Continued)

FOREIGN PATENT DOCUMENTS

CN 102770818 A 11/2012
CN 103180693 A 6/2013
(Continued)

OTHER PUBLICATIONS

Flammini et al., The Sense of Time in Open Metering System, 2011 IEEE, 6 pp.*

(Continued)

*Primary Examiner* — Toan Le

(57) ABSTRACT

An electrical panel meter system may include a controller and a plurality of meter modules. Each meter module may be configured to monitor, read, and store at the meter module electrical data related to electrical power provided to a respective branch circuit of the electrical panel meter system. The controller may be configured to issue a read command simultaneously to each meter module and to store a timestamp indicative of the issuance of the read command. The controller may also be configured to issue a send command sequentially to each meter module to transmit its stored electrical data reading. The controller may further be configured to append the stored timestamp to each received electrical data reading to create a timestamped electrical data reading suitable for use in power quality analyzes. Methods of timestamping electrical data sampled in an electrical panel meter system are also provided, as are other aspects.

18 Claims, 4 Drawing Sheets

(56) References Cited

U.S. PATENT DOCUMENTS

| | | |
|---|---|---|
| 2007/0047458 A1 | 3/2007 | Adkisson |
| 2007/0214363 A1 | 9/2007 | Ishii |
| 2008/0255782 A1 | 10/2008 | Bilac et al. |
| 2010/0082995 A1 | 4/2010 | Dees |
| 2010/0103921 A1 | 4/2010 | Lorek et al. |
| 2011/0080197 A1 | 4/2011 | Fan |
| 2011/0145203 A1 | 6/2011 | Lobuono |
| 2011/0248874 A1 | 10/2011 | Cannillo |
| 2012/0130656 A1 | 5/2012 | Bickel |
| 2013/0151797 A1 | 6/2013 | Truong |
| 2013/0179555 A1 | 7/2013 | Neumann et al. |
| 2013/0262911 A1 | 10/2013 | Boerger et al. |
| 2014/0312693 A2 | 10/2014 | Powell et al. |
| 2014/0368190 A1 | 12/2014 | Sykora et al. |

FOREIGN PATENT DOCUMENTS

| | | |
|---|---|---|
| CN | 103222151 A | 7/2013 |
| EP | 2549280 A1 | 1/2013 |
| KR | 20030034326 A | 5/2003 |
| KR | 200325154 Y1 | 9/2003 |
| WO | 201409976 A1 | 1/2014 |

OTHER PUBLICATIONS

Bruce G. Bailey, Power System Protection—Power Monitoring—Data Logging—Remote Interrogation System, Aug. 6, 2002, IEEE, pp. 109-112.*

Abstract of Bruce G. Bailey reference, Aug. 6, 2002, 2 pp.*

Irwin et al., Exploiting Home Automation Protocols for Load Monitoring in Smart Buildings, Nov. 1, 2011, BuildSys' 11, Seattle, WA, 6 pp.*

European Search Report dated Aug. 18, 2016 corresponding to European Application No. 16157296.1 filed Feb. 25, 2016 (8 pages).

Translation of Korean Office Action dated Feb. 24, 2017 corresponding to Korean Application No. 2016-0025774 filed Mar. 3, 2016 (14 pages).

Canadian Office Action dated May 31, 2017 corresponding to Canadian Application No. 2922328 filed Mar. 2, 2016 (6 pages).

* cited by examiner

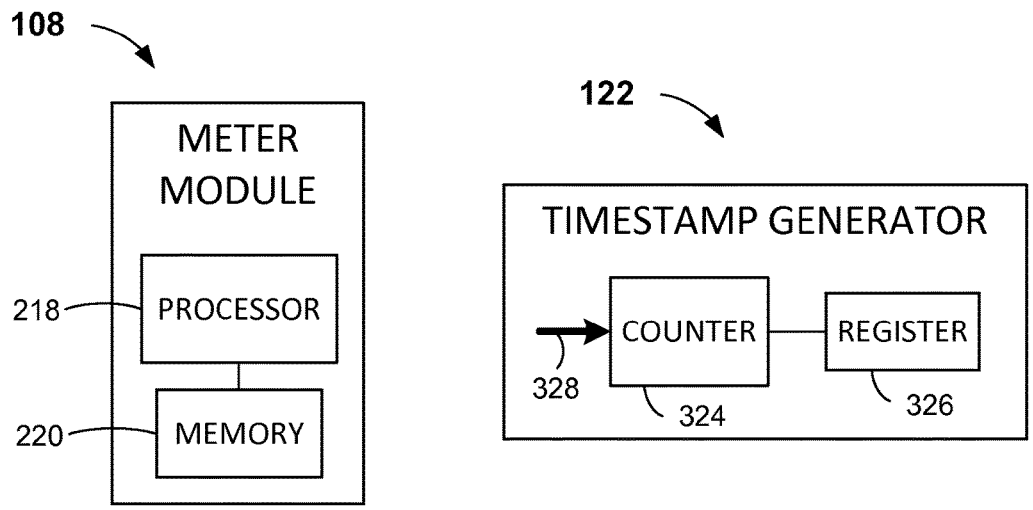
FIG. 2
FIG. 3
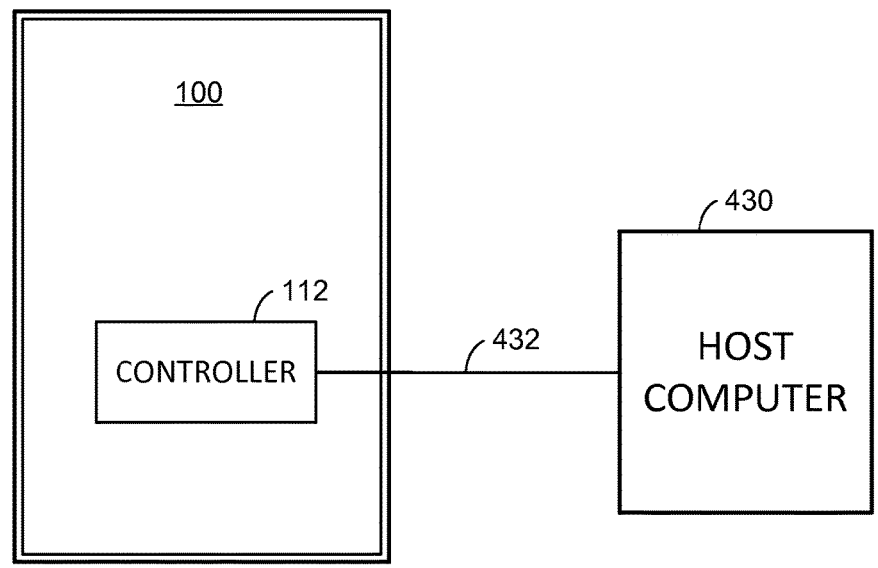
FIG. 4

APPARATUS AND METHODS FOR TIMESTAMPING ELECTRICAL DATA IN A PANEL METER

RELATED APPLICATION

This claims the benefit of U.S. Provisional Patent Application No. 62/127,915, filed Mar. 4, 2015 and titled "Timestamping Electrical Data In A Panel Meter," the disclosure of which is hereby incorporated by reference herein in its entirety for all purposes.

FIELD

The invention relates generally to an electrical panel meter system that can monitor a plurality of branch circuits and, more particularly, to an electrical panel meter system that can timestamp individual electrical data readings sampled at each branch circuit in the panel meter system.

BACKGROUND

Commercial and/or industrial electrical panel meter systems may provide electrical power and circuit-breaker protection to a plurality of electrical branch circuits via an electrical panel coupled to a power source. Commercial and/or industrial electrical panel meter systems may have, e.g., 40-50 branch circuits. Each branch circuit may have its own meter module mounted in the electrical panel that may provide electrical data readings at periodic intervals as determined by a controller of the electrical panel meter system. The electrical data readings may include one or more of, e.g., power (kilowatts), power per unit of time (kilowatt-hours), voltage (volts), current (amps), power factor, etc., and/or related parameters and combinations thereof. In some known electrical panel meter systems, the controller may sequentially command each of the meter modules to sample and transmit back to the controller respective electrical data readings. Cycling though all of the meter modules may require a total of, e.g., 10 seconds, as each meter module reads and transmits its electrical data back to the controller. Each electrical data reading is typically not timestamped. After the controller receives the electrical data readings from all of the meter modules, the electrical data readings may be stored in a memory at the electrical panel or uploaded to a host computer. In each case, a timestamp may be generated. However, such a timestamp representing a relatively large span of time (e.g., the 10 seconds) over which all of the electrical data readings were taken may not be suitable for high accuracy power quality analyses commonly performed on one or more branch circuits in a commercial and/or industrial electrical system. Such high accuracy power quality analyses may require each electrical data reading timestamp to have, e.g., millisecond resolution.

Accordingly, there is a need for apparatus and methods for timestamping each electrical data reading performed by each meter module in an electrical panel meter system.

SUMMARY

According to one aspect, a method of timestamping electrical data sampled in an electrical panel meter system is provided. The method includes issuing a read command from a controller simultaneously to each one of a plurality of meter modules to read electrical data, the controller and the plurality of meter modules housed in an electrical panel enclosure; storing a timestamp indicative of the issuance of the read command; reading and storing at each one of the plurality of meter modules respective electrical data in response to receiving the read command; issuing a send command from the controller sequentially to each one of the plurality of meter modules to send their respective electrical data readings to the controller; receiving at the controller the respective electrical data readings from each one of the plurality of meter modules; and appending the stored timestamp to each of one the respective electrical data readings received at the controller to create respective timestamped electrical data readings.

According to another aspect, an electrical panel meter system is provided that includes a main line connector for coupling to a source of power; a plurality of branch circuit connectors; a plurality of circuit breakers, each one of the plurality of circuit breakers coupled between the main line connector and a respective one of the plurality of branch circuit connectors; a plurality of meter modules, each one of the plurality of meter modules coupled to a respective one of the plurality of branch circuit connectors; a system memory; and a controller coupled to the memory and the plurality of meter modules, the controller comprising a timestamp generator, wherein the controller is configured to issue a read command simultaneously to each one of the plurality of meter modules to read electrical data; store in the system memory a timestamp indicative of the issuance of the read command as generated by the timestamp generator; issue a send command sequentially to each one of the plurality of meter modules to send a stored electrical data reading to the controller; and append the timestamp stored in the system memory to each one of the electrical data readings received at the controller to create respective timestamped electrical data readings.

According to a further aspect, a non-transitory computer-readable medium is provided that includes computer instructions capable of being executed in a controller of an electrical panel meter system, the computer instructions configured to cause the controller to issue a read command simultaneously to each one of a plurality of meter modules in the electrical panel meter system to read electrical data; store a timestamp indicative of the issuance of the read command; issue a send command sequentially to each one of the plurality of meter modules to send their respective electrical data readings to the controller; and append the stored timestamp to each one of the respective electrical data readings received at the controller to create respective timestamped electrical data readings.

Still other aspects, features, and advantages of the invention may be readily apparent from the following detailed description wherein a number of example embodiments and implementations are described and illustrated, including the best mode contemplated for carrying out the invention. The invention may also include other and different embodiments, and its several details may be modified in various respects, all without departing from the scope of the invention. Accordingly, the drawings and descriptions are to be regarded as illustrative in nature, and not as restrictive. The invention covers all modifications, equivalents, and alternatives of the aspects disclosed herein.

BRIEF DESCRIPTION OF DRAWINGS

Persons skilled in the art will understand that the drawings, described below, are for illustrative purposes only. The drawings are not necessarily drawn to scale and are not intended to limit the scope of this disclosure in any way.

FIG. 2 illustrates a block diagram of a meter module according to embodiments.

FIG. 3 illustrates a block diagram of a timestamp generator according to embodiments.

FIG. 4 illustrates a system block diagram of another electrical panel meter system according to embodiments.

DETAILED DESCRIPTION

Figure 1:
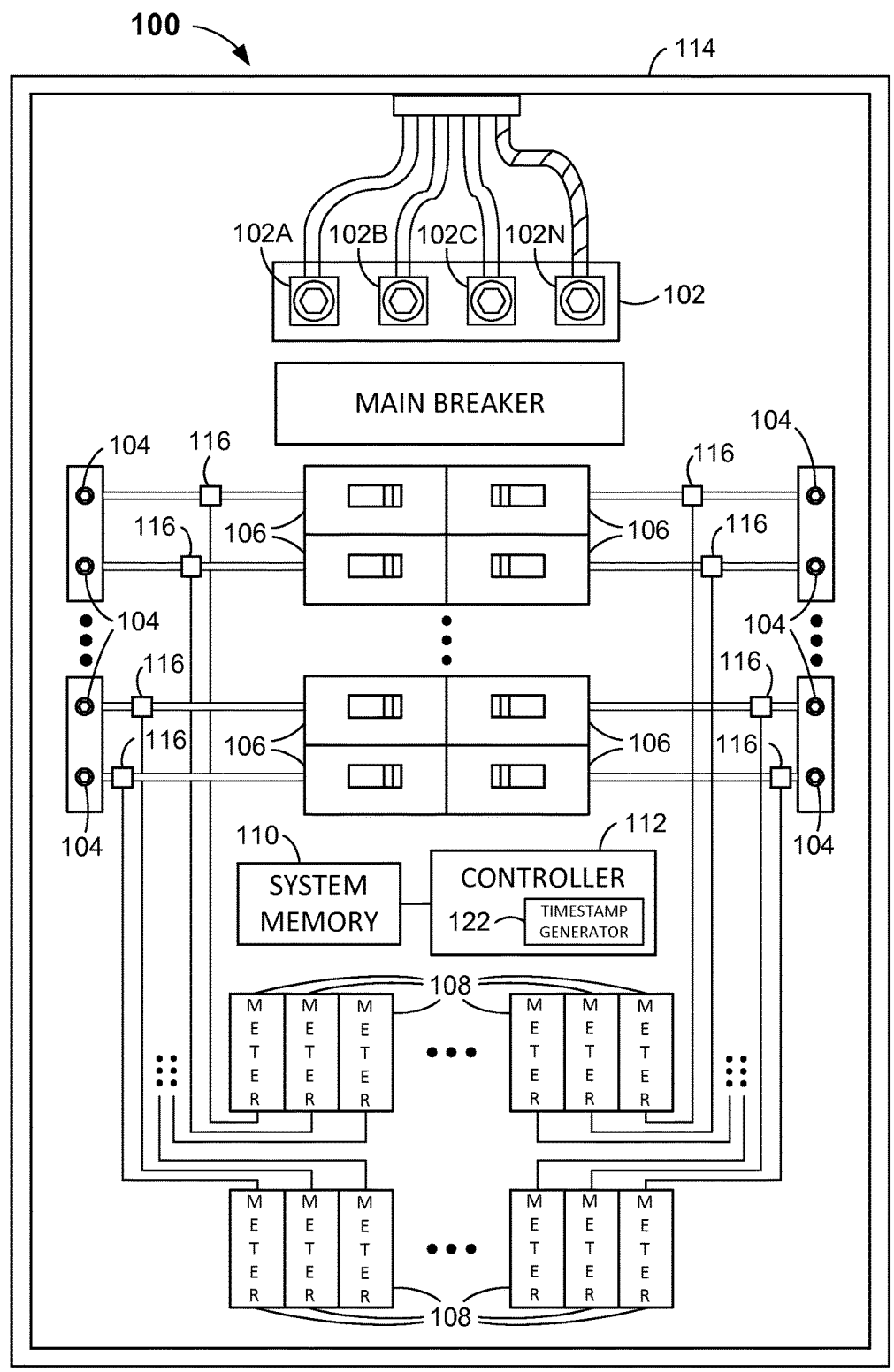
FIG. 1 illustrates a system block diagram of an electrical panel meter system according to embodiments.

Reference will now be made in detail to the example embodiments of this disclosure, which are illustrated in the accompanying drawings. Wherever possible, the same reference numbers will be used throughout the drawings to refer to the same or like parts.

The aforementioned deficiencies of some commercial and/or industrial electrical panel meter systems may be overcome by one or more embodiments of the invention. In one aspect, an electrical panel meter system may include a controller, a system memory, and a plurality of meter modules. The controller may include a timestamp generator, and each meter module may include a processor and a memory. Each meter module may be configured to monitor, read, and store at the meter module real-time electrical data related to electrical power provided to a respective branch circuit of the electrical panel meter system. The controller may be configured to issue a read command simultaneously to each meter module and to store a timestamp (i.e., date and time of day) in the system memory indicative of the issuance of the read command. The controller may also be configured to issue a send command sequentially to each meter module to transmit its stored electrical data reading to the controller. In response to receiving electrical data readings from the meter modules, the controller may further be configured to append the stored timestamp to each received electrical data reading to create a timestamped electrical data reading suitable for use in high quality power quality analyses. The controller may still further be configured to store the timestamped electrical data readings in the system memory and/or upload the timestamped electrical data readings to a host computer. In some embodiments, multiple cycles of electrical data readings from each of the meter modules may be stored in the system memory. In some embodiments, uploading to a host computer may occur after each cycle of electrical data readings, at regular intervals (e.g., daily or weekly), or in response to an upload request from the host computer.

In other aspects, methods of timestamping electrical data sampled in an electrical panel meter system are provided, as will be explained in greater detail below in connection with FIGS. 1-7. If a use case required very accurate time stamping of the energy readings, such as some power quality measurements, the accuracy of the time stamp could be improved to less than 100 milliseconds. The following implementation would provide the appropriate timestamps. A new message to the meter modules would have to be supported which would cause all the modules to read the real-time data and store it for future reading. This message would be broadcast to all the meter modules at the start of a polling period. A controller would initiate each polling cycle by broadcasting the message described above and latch the time and correct it for the time to transmit the message. It could then poll all the meters as usual. The controller read data messages would all contain the timestamp latched above. That way the host reading the data knows accurately what time the data was sampled. These could be manufacturer specific extensions to the modbus protocol or a proprietary messaging protocol.

FIG. 1 illustrates an electrical panel meter system 100 in accordance with one or more embodiments. Electrical panel meter system 100 may include a main line connector 102, a plurality of branch circuit connectors 104, a plurality of circuit breakers 106, a plurality of meter modules 108, a system memory 110, and a controller 112. Electrical panel meter system 100 may also include an electrical panel enclosure 114 configured to house main line connector 102, the plurality of branch circuit connectors 104, the plurality of circuit breakers 106, the plurality of meter modules 108, system memory 110, and controller 112. Electrical panel meter system 100 may include additional components not shown in FIG. 1 or described herein. In some embodiments, electrical panel meter system 100 may be an integrated electrical circuit panel that includes an SEM3™ Embedded Micro Metering Module™ by Siemens Industry, Inc., of Norcross, Ga., USA.

Main line connector 102 may be configured to couple to a source of power and may have three terminals 102A, 102B, and 102C for coupling to respective power phases (e.g., A, B, and C) of the source of power. Main line connector 102 may also have a neutral terminal 102N for coupling to a system neutral conductor. Each of terminals 102A, 102B, 102C and 102N may be coupled to respective power or neutral bus bars (not shown) within electrical panel enclosure 114. The source of power may be an AC power system providing a line-to-line voltage of up to about 480 volts AC and a line-to-neutral voltage of less than 277 volts AC. Other embodiments may be configured to receive other ranges of voltages.

Branch circuit connectors 104 may each be configured to be coupled to a branch circuit of electrical panel meter system 100. Each branch circuit may receive power and circuit-breaker protection from electrical panel meter system 100. Each circuit breaker 106 may be coupled between main line connector 102 and a respective branch circuit connector 104. In some embodiments, circuit breakers 106 may be rated from 50 amps to 1200 amps and may be single pole, double pole, or 3-pole. Other suitable types of circuit breakers 106 may be used in electrical panel meter system 100. In some embodiments, electrical panel meter system 100 may have 40-50 branch circuit connectors 104 and corresponding circuit breakers 106. Other embodiments may have more or less branch circuit connectors 104 and circuit breakers 106.

Each meter module 108 may be coupled to a respective branch circuit connector 104 to measure and/or sample current and/or voltage on a respective branch circuit. In some embodiments, one or more meter modules 108 may include and/or be coupled to a respective solid core or split core current transformer 116, which may be coupled to an electrical branch circuit conductor coupled to a respective branch circuit connector 104. Solid or split core current transformers 116 may be used to measure current flowing through the branch circuit conductor. Each meter module 108 may include a processor 218 and a memory 220 in accordance with one or more embodiments, as shown in FIG. 2. Each meter module 108 may be configured to process current and/or voltage measurements or samplings in processor 218 via one or more algorithms stored in memory 220 to determine one or more parameters, such as, e.g., maximum current, maximum voltage, energy consumption, percent load, peak power demand, power factor, apparent power, real power, reactive power, and/or total power for the branch circuit coupled to the respective branch circuit connector 104. Other computer instructions capable of being executed by processor 218 may be stored in memory 220. In some embodiments, one or more meter modules 108 may additionally or alternatively include one or more voltage sensors and/or other current sensors. Each meter module 108 may be configured as a Modbus RTP (Remote Terminal Unit) supporting a Modbus TCP/IP (Transmission Control Protocol/Internet Protocol). Modbus is a serial communication protocol. Other suitable communication protocols may alternatively be used. In some embodiments, the number of meter modules 108 in electrical panel meter system 100 may correspond equally to the number of branch circuit connectors 104. In other embodiments, the number of meter modules 108 may be different than the number of branch circuit connectors 104.

Controller 112 may be coupled to system memory 110 and to each meter module 108 via a communication infrastructure, which may include one or more communication buses (not shown in FIG. 1 for clarity). In some embodiments, controller 112 may be configured to utilize, e.g., a Modbus TCP/IP for communicating with system memory 110, each meter module 108, and other internally and externally coupled components. Controller 112 may provide a single Modbus slave address for the components in electrical panel meter system 100. Alternatively, other suitable communication protocols may be used, including any suitable master-slave/client-server communication infrastructure and protocol. Controller 112 may execute any suitable operating system and one or more applications stored in system memory 110 to provide energy monitoring and related data calculation and analysis functions. In particular, controller 112 may perform various calculations and/or determinations related to the electrical data readings received from meter modules 108. In some embodiments, controller 112 may communicate with meter modules 108 via Class 2 signals representing A, B, C, and N voltage levels for metering calculations.

Controller 112 may also include and/or be coupled to a timestamp generator 122. In some embodiments, timestamp generator 122 may provide timestamp (i.e., date and time of day) values having at least millisecond resolution. In some embodiments, timestamp generator 122 may be configured to operate in accordance with a POSIX time system having microsecond resolution with timestamp values encoded as 64-bit binary numbers. In some embodiments, as shown in FIG. 3, timestamp generator 122 may include a counter 324 and a counter register 326 to store an internal count of clock cycles. Timestamp generator 122 may receive a clock signal 328 either externally or internally using any suitable clock source in electrical panel meter system 100. Timestamp generator 122 may be configured in any suitable manner, such as, e.g., in hardware (as an integrated circuit, discrete logic gates, gate array, or application-specific integrated circuit (ASIC), etc.), in firmware, or in programming code that can be executed by controller 112 or other processor of electrical panel meter system 100.

In some embodiments, electrical panel meter system 100 may be configured to include a host computer 430 coupled to controller 112 via a cable 432, as shown in FIG. 4 (other components of electrical panel meter system 100 not shown for clarity). In some embodiments, cable 432 may be a 600 volt isolated CAT6 cable. Host computer 430 may be configured to receive electrical meter readings from electrical panel meter system 100. In some embodiments, electrical meter readings may be uploaded to host computer 430 after each cycle of electrical data readings (also referred to herein as a polling cycle), at regular intervals (e.g., daily or weekly), and/or in response to an upload request from host computer 430. Host computer 430 may be, e.g., part of a building management or electrical power monitoring system.

Figure 5:
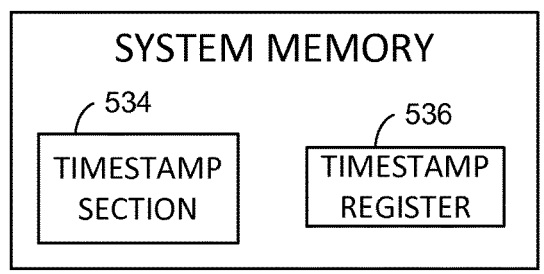
FIG. 5 illustrates a block diagram of a system memory according to embodiments.

System memory 110 may include one or more memory devices including, e.g., a dynamic random access memory (DRAM). Computer instructions capable of being executed by controller 112 may be stored in system memory 110. System memory 110 may also include a timestamp memory section 534 and a timestamp register 536 associated with timestamp generator 122, as shown in FIG. 5, in accordance with one or more embodiments. Timestamp register 536 may contain one or more commands that when executed may cause a timestamp value from timestamp generator 122 to be stored in timestamp memory section 534 of system memory 110.

Note that electrical panel meter system 100 may be configured in some embodiments to include software, hardware, and/or firmware components in addition to or different than those shown in FIGS. 1-5 and described herein.

Figure 6:
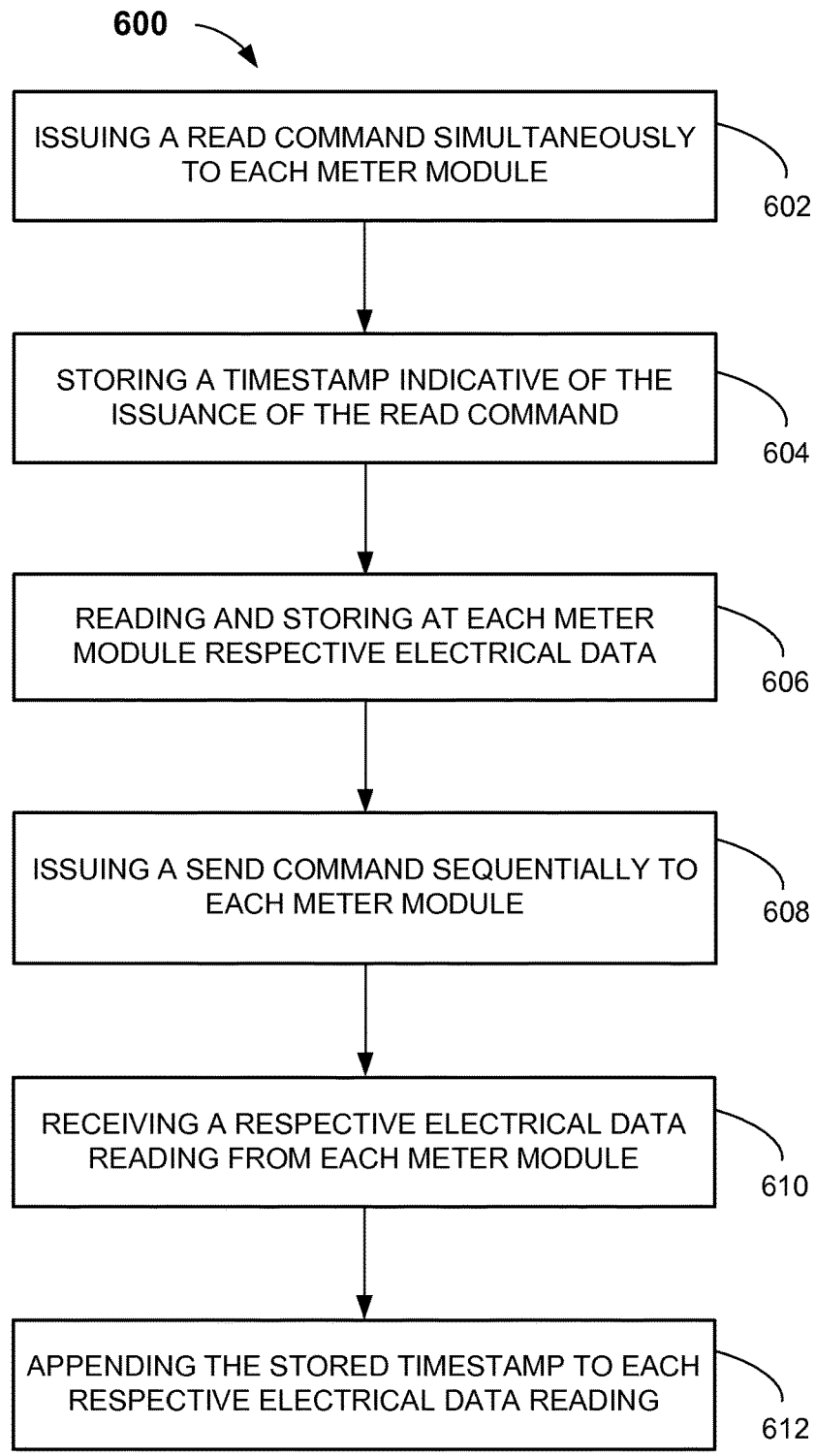
FIG. 6 illustrates a flowchart of a method of timestamping electrical data sampled in an electrical panel meter system according to embodiments.

FIG. 6 illustrates a flowchart of a method 600 of timestamping electrical data sampled in an electrical panel meter system in accordance with one or more embodiments. In some embodiments, the accuracy of the timestamp may be 100 milliseconds or less. Method 600 may include at process block 602 issuing a read command from a controller simultaneously to each one of a plurality of meter modules to read electrical data, wherein the controller and the plurality of meter modules are housed in an electrical panel enclosure. For example, referring to FIG. 1, controller 112 may issue a read command simultaneously to all meter modules 108 to read electrical data. The electrical data may include readings and/or measurements of real-time current, voltage, and/or power presently being supplied to a branch circuit coupled to a respective meter module 108 via a coupling to a respective branch connector 104. The electrical data may also include parameters derived or calculated from the current, voltage, and/or power readings, such as, e.g., power per unit of time, power factor, percent load, peak demand, maximum current, maximum voltage, or combinations thereof. In some embodiments, controller 112 may communicate with meter modules 108 via a Modbus TCP/IP. Other suitable communication protocols may be used instead. Method 600 may include, in some embodiments, issuing a read command from the controller at regular intervals, such as, e.g., every 10 seconds. Other suitable intervals may alternatively be used.

At process block 604, method 600 may include storing a timestamp indicative of the issuance of the read command. Referring to FIGS. 1, 3, and 5, upon issuing the read command, controller 112 may signal timestamp generator 122 to generate a timestamp. Timestamp generator 122 may respond by executing one or more commands in timestamp register 536 of system memory 110 to cause a timestamp value based on counter 324 and a value in counter register 326 of timestamp generator 122 to be stored in timestamp memory section 534 of system memory 110. The timestamp value may have at least millisecond resolution and, in some embodiments, may a 64-bit number representing a date and time of day based on a POSIX time system having microsecond resolution. The timestamp may be based on other time systems.

In some embodiments, method 600 may include correcting the stored timestamp for an average or longest transfer delay of the read command to the meter modules. This may be done, e.g., by controller 112 arithmetically adjusting the stored timestamp value by a predetermined amount, which may be, e.g., an estimated average or longest transfer delay. In other embodiments, controller 112 may delay the "generate a timestamp" signal to timestamp generator 122 by an amount of time corresponding to a predetermined average or longest transfer delay. Alternatively, any suitable method of correcting a timestamp for a transfer delay may be used.

At process block 606, method 600 may include reading and storing at each one of the plurality of meter modules respective electrical data in response to receiving the read command. For example, referring to FIGS. 1 and 2, each meter module 108 may respond to receiving a read command from controller 112 by reading electrical data such as, e.g., voltage and/or current, and storing those readings in memory 220 of meter module 108. The electrical data stored in memory 220 may also include other parameters calculated or derived from the voltage and/or current readings by processor 218 of meter module 108. Those parameters may include, e.g., maximum current, maximum voltage, energy consumption, percent load, peak power demand, power factor, apparent power, real power, reactive power, and/or total power for the branch circuit monitored by a respective meter module 108. In some embodiments, the stored electrical data readings may include a meter module identifier as described below in connection with FIG. 7. In other embodiments, a meter module identifier may be appended to the stored electrical data readings upon transfer of the stored electrical data readings to the controller as described below in connection with process block 610.

At process block 608, method 600 may include issuing a send command from the controller sequentially to each one of the plurality of meter modules to send their respective electrical data readings to the controller. Again referring to FIG. 1, controller 112 may issue a send command to each meter module 108 sequentially during a polling cycle. As in process block 602, controller 112 may communicate with meter modules 108 via a Modbus TCP/IP. Other suitable communication protocols may be used instead.

At process block 610, method 600 may include receiving at the controller the respective electrical data readings sequentially from each one of the plurality of meter modules. In some embodiments, process blocks 608 and 610 may be performed in a loop as follows: controller 112 may issue a send command to a first meter module 108, receive the electrical data readings from the first meter module 108, issue a send command to a second meter module after receiving the electrical data readings from the first meter module 108, receive the electrical data readings from the second meter module, and so on.

Figure 7:
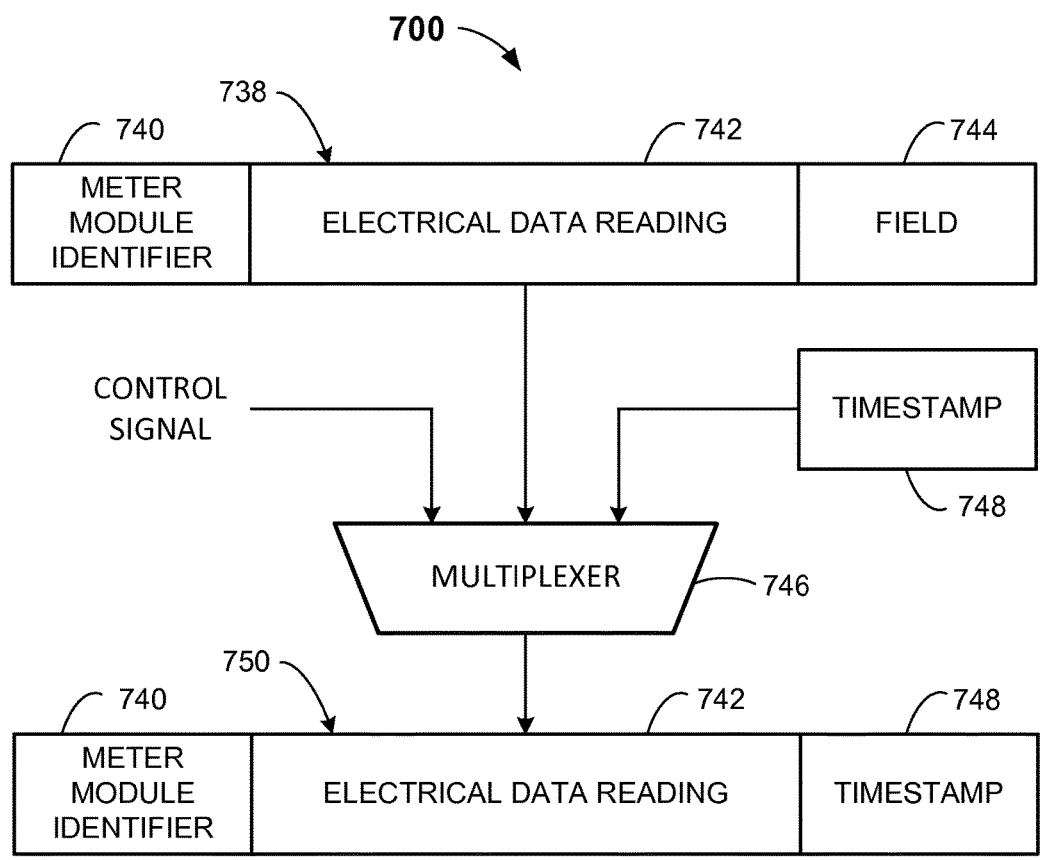
FIG. 7 illustrates a block diagram of a timestamp appending process according to embodiments.

As shown in FIG. 7, the electrical data readings received at controller 112 may be encoded in a data structure 738. Data structure 738 may have a meter module identifier field 740, an electrical data reading field 742, and at least one field 744, which may be, e.g., an unused, reserved, overhead, destination address, or check field. Field 744 may be of other types of fields. Meter module identifier field 740 may include a meter module identifier that identifies the particular meter module 108 that sent the electrical data reading encoded in electrical data reading field 742. Data structure 738 and each of its fields 740, 742, and 744 may have any suitable length to accommodate the data encoded therein. In some embodiments, each data structure 738 received from a respective meter module 108 may be stored in system memory 110.

At process block 612, method 600 may include appending the stored timestamp to each one the respective electrical data readings received at the controller during the same polling cycle to create respective timestamped electrical data readings. FIG. 7 illustrates a timestamp appending process 700 in accordance with one or more embodiments. In response to receiving an electrical data reading (in the form of data structure 738) at process block 610, a multiplexer 746 may receive a control signal from controller 112, a received data structure 738, and a timestamp 748 previously generated at process block 604 by timestamp generator 122 and stored in timestamp memory section 534. Multiplexer 746 may output a data structure 750 wherein the contents of field 744 of data structure 738 may be replaced with timestamp 748. The contents of field 744 may either be not needed at this point, may not be used, or may be null. In some embodiments, the length of field 744 may be same as the length of timestamp 748 and, alternatively, may be longer than the length of timestamp 748. In those embodiments, appropriate padding (e.g., leading zeros) may be inserted. The contents of meter module identifier field 740 and electrical data reading field 742 may not be altered during timestamp appending process 700. Alternatively, any suitable technique may be used to append a timestamp to an electrical data reading. Note that in some embodiments process block 612 may be performed in a loop with process blocks 608 and 610. That is, a timestamp may be appended to each electrical data reading upon receipt of each electrical data reading at the controller. Alternatively, timestamp appending process 700 may be performed after receipt of all the electrical data readings from the meter modules.

In some embodiments, method 600 may further include storing a respective data structure 750 in system memory 110 for each of the meter modules 108. Data structures 750 containing electrical data readings from each of the meter modules 108 for multiple polling cycles may be stored in system memory 110.

Method 600 may further include in some embodiments uploading each data structure 750 to host computer 430 upon completion of a polling cycle or upon completion of multiple polling cycles wherein the data structures 750 from those multiple polling structures may be stored in system memory 110. Uploading may occur at scheduled intervals, in response to a completion of a polling cycle, and/or upon issuance of an uploading request from host computer 430.

In some embodiments, a non-transitory computer-readable medium, such as, e.g., a removable storage disk or device, may include computer instructions capable of being executed in controller 112 of electrical panel meter system 100 and/or of performing method 600.

In some embodiments, a non-transitory computer-readable medium, such as, e.g., a removable storage disk or device may include computer instructions capable of being executed in a processor of a meter module, such as, e.g., processor 218 of meter module 108. The computer instructions may be configured to cause the processor of the meter module to read electrical data in response to receiving a read command from a controller, such as, e.g., controller 112. The computer instructions may also be configured to cause the processor of the meter module to store the electrical data reading in a memory of the meter module, such as, e.g., memory 220 of meter module 108. And, the computer instructions may be configured to cause the processor of the meter module to transfer the stored electrical data reading from its memory to the controller in response to receiving a send command from the controller.

Persons skilled in the art should readily appreciate that the invention described herein is susceptible of broad utility and application. Many embodiments and adaptations of the invention other than those described herein, as well as many variations, modifications, and equivalent arrangements, will be apparent from or reasonably suggested by the invention and the foregoing description thereof, without departing from the substance or scope of the invention. For example, although described in connection with the timestamping of electrical data in an electrical panel meter system, the apparatus and methods described herein may have application in other electrical metering or measurement applications where highly accurate timestamping of data is required in order to later utilize that data. Accordingly, while the invention has been described herein in detail in relation to specific embodiments, it should be understood that this disclosure is only illustrative and presents examples of the invention and is made merely for purposes of providing a full and enabling disclosure of the invention. This disclosure is not intended to limit the invention to the particular apparatus, devices, assemblies, systems, or methods disclosed, but, to the contrary, the intention is to cover all modifications, equivalents, and alternatives falling within the scope of the invention, as defined by the following claims.

What is claimed is:

1. A method of operating an electrical panel meter system, the method comprising:
   providing electrical power to a plurality of branch circuits;
   measuring current or voltage on each of the plurality of branch circuits with a respective one of a plurality of meter modules;
   issuing a read command from a controller simultaneously to each one of the plurality of meter modules by broadcasting the read command to all the plurality of meter modules at a start of a polling cycle to read real-time electrical data including measured current or voltage, the controller and the plurality of meter modules housed in an electrical panel enclosure;
   initiating the polling cycle indicative of a cycle of readings of the real-time electrical data by broadcasting of the read command;
   storing a timestamp provided by the controller indicative of the issuance of the read command;
   reading and storing for future reading at each one of the plurality of meter modules respective electrical data including measured current or voltage in response to receiving the read command;
   issuing a send command from the controller sequentially during the polling cycle to each one of the plurality of meter modules to send their respective electrical data readings including the measured current or voltage to the controller;
   receiving at the controller the respective electrical data readings including the measured current or voltage from each one of the plurality of meter modules; and
   appending the stored timestamp to each one of the respective electrical data readings including the measured current or voltage received at the controller to create respective computer-readable data structures comprising timestamped electrical data readings including the measured current or voltage for the polling cycle.

2. The method of claim 1 further comprising storing the respective computer-readable data structures comprising timestamped electrical data readings including the measured current or voltage in a memory housed in the electrical panel enclosure.

3. The method of claim 1 further comprising uploading the respective computer-readable data structures comprising timestamped electrical data readings including the measured current or voltage from the electrical panel to a host computer.

4. The method of claim 3 wherein the uploading occurs in response to receiving an upload command from the host computer.

5. The method of claim 1 further comprising correcting the stored timestamp for an average transfer delay of the read command to each one of a plurality of meter modules.

6. The method of claim 1 wherein the issuing a read command occurs at regular intervals or every 10 seconds.

7. The method of claim 1 wherein the storing a timestamp comprises storing the timestamp having at least millisecond resolution.

8. The method of claim 1 wherein each respective computer-readable data structure further comprises a meter module identifier and a measurement or calculation of at least one of power, power per unit of time, power factor, a related parameter thereof, or combinations thereof.

9. An electrical panel meter system, comprising:
   a main line connector for coupling to a source of power;
   a plurality of branch circuit connectors;
   a plurality of circuit breakers, each one of the plurality of circuit breakers coupled between the main line connector and a respective one of the plurality of branch circuit connectors;
   a plurality of meter modules, each one of the plurality of meter modules coupled to a respective one of the plurality of branch circuit connectors and configured to measure current or voltage;
   a system memory; and
   a controller coupled to the system memory and to the plurality of meter modules, the controller comprising a timestamp generator, wherein:
   the controller is configured to:
   issue a read command simultaneously to each one of the plurality of meter modules by broadcasting the read command to all the plurality of meter modules at a start of a polling cycle to read electrical data including measured current or voltage;
   initiate the polling cycle indicative of a cycle of readings of the real-time electrical data by broadcasting of the read command;
   store in the system memory a timestamp indicative of the issuance of the read command as generated by the timestamp generator;
   read and store for future reading at each one of the plurality of meter modules respective electrical data including measured current or voltage;
   issue a send command sequentially to each one of the plurality of meter modules to send a stored electrical data reading including measured current or voltage to the controller; and
   append the timestamp stored in the system memory to each one of the electrical data readings including the measured current or voltage received at the controller to create respective computer-readable data structures comprising timestamped electrical data readings including the measured current or voltage.

10. The electrical panel meter system of claim 9, further comprising an electrical panel enclosure configured to house the main line connector, the plurality of branch circuit connectors, the plurality of circuit breakers, the plurality of meter modules, the system memory, and the controller.

11. The electrical panel meter system of claim 9, wherein each one of the plurality of meter modules comprises a processor and a meter module memory.

12. The electrical panel meter system of claim 9, wherein each one of the plurality of meter modules is configured to:
   read electrical data including measured current or voltage in response to receiving the read command from the controller;
   store the electrical data reading including the measured current or voltage in a respective meter module memory; and
   transfer the stored electrical data reading including the measured current or voltage to the controller in response to receiving the send command from the controller.

13. The electrical panel meter system of claim 12, wherein the electrical data further comprises a measurement or calculation of at least one of power, power per unit of time, power factor, a related parameter thereof or combinations thereof.

14. The electrical panel meter system of claim 12, wherein each one of the plurality of meter modules is configured to store thereat the electrical data reading with a respective meter module identifier.

15. A non-transitory computer-readable medium comprising computer instructions capable of being executed in a processor of a meter module of an electrical panel meter system, the computer instructions configured to cause the processor to perform the read, store, and transfer of claim 12.

16. The electrical panel meter system of claim 9, wherein the controller is configured to upload the respective computer-readable data structures comprising timestamped electrical data readings including the measured current or voltage from each of the plurality of meter modules to a host computer.

17. The electrical panel meter system of claim 9, wherein the controller is configured to issue the read command at regular intervals or every 10 seconds.

18. The electrical panel meter system of claim 9, wherein the controller is configured to store the timestamp having at least millisecond resolution.

* * * * *